(12) United States Patent
Shang et al.

(10) Patent No.: US 11,869,578 B2
(45) Date of Patent: Jan. 9, 2024

(54) MEMORY BANK AND MEMORY

(71) Applicant: CHANGXIN MEMORY TECHNOLOGIES, INC., Anhui (CN)

(72) Inventors: Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 131 days.

(21) Appl. No.: 17/447,569

(22) Filed: Sep. 13, 2021

(65) Prior Publication Data

US 2021/0407576 A1 Dec. 30, 2021

Related U.S. Application Data

(63) Continuation of application No. PCT/CN2021/073981, filed on Jan. 27, 2021.

(30) Foreign Application Priority Data

Mar. 30, 2020 (CN) .......................... 202010237983.6

(51) Int. Cl.
*G11C 7/18* (2006.01)
*G11C 11/408* (2006.01)
*G11C 5/10* (2006.01)
*G11C 11/402* (2006.01)
*G11C 11/4097* (2006.01)

(52) U.S. Cl.
CPC ............ *G11C 11/4087* (2013.01); *G11C 5/10* (2013.01); *G11C 11/4023* (2013.01); *G11C 11/4097* (2013.01)

(58) Field of Classification Search
CPC ..................................................... G11C 11/40
See application file for complete search history.

(56) References Cited

U.S. PATENT DOCUMENTS

| 5,404,338 A | 4/1995 | Murai |
| 5,485,426 A | 1/1996 | Lee |
| 5,970,010 A | 10/1999 | Hira |

(Continued)

FOREIGN PATENT DOCUMENTS

| CN | 1542964 A | 11/2004 |
| CN | 1666291 A | 9/2005 |

(Continued)

OTHER PUBLICATIONS

Second Office Action of the Chinese application No. 202010237983.6, dated Dec. 19, 2022.

(Continued)

*Primary Examiner* — Min Huang
(74) *Attorney, Agent, or Firm* — Syncoda LLC; Feng Ma

(57) ABSTRACT

A memory bank includes at least one storage module, each storage module including a read-write control circuit, a column decoding circuit and a plurality of storage arrays, the plurality of storage arrays being divided into a first unit and a second unit; a first decoding selective signal line, electrically connected to the column decoding circuit and the storage arrays in the first unit; a second decoding selective signal line, electrically connected to the column decoding circuit and the storage arrays in the second unit; a first data signal line; and a second data signal line.

20 Claims, 8 Drawing Sheets

(56) References Cited

U.S. PATENT DOCUMENTS

| | | | | |
|---|---|---|---|---|
| 5,991,223 A * | 11/1999 | Kozaru | ............... | G11C 7/1018 365/233.17 |
| 7,359,252 B2 | 4/2008 | Suh | | |
| 7,835,208 B2 | 11/2010 | Song | | |
| 8,120,985 B2 | 2/2012 | Kunce | | |
| 9,007,812 B2 * | 4/2015 | Koyama | ............ | H01L 27/0207 365/230.06 |
| 9,720,610 B2 | 8/2017 | Hsiao | | |
| 2003/0031069 A1 | 2/2003 | Sakemi | | |
| 2004/0114449 A1 * | 6/2004 | Ohtani | ................ | G11C 29/848 365/230.03 |
| 2006/0171237 A1 * | 8/2006 | Kaku | ...................... | G11C 7/18 365/230.03 |
| 2009/0207648 A1 | 8/2009 | Song | | |
| 2012/0063209 A1 | 3/2012 | Koyama | | |
| 2016/0034220 A1 | 2/2016 | Hsiao | | |
| 2017/0287537 A1 | 10/2017 | Hsiao | | |
| 2021/0295920 A1 * | 9/2021 | Ichikawa | ............... | G11C 16/26 |

FOREIGN PATENT DOCUMENTS

| | | |
|---|---|---|
| CN | 102024491 A | 4/2011 |
| CN | 102376346 A | 3/2012 |
| CN | 102436846 A | 5/2012 |
| CN | 102932610 A | 2/2013 |
| CN | 103943138 A | 7/2014 |
| CN | 104867517 A | 8/2015 |
| CN | 105261391 A | 1/2016 |
| CN | 106251892 A | 12/2016 |
| CN | 110111833 A | 8/2019 |
| EP | 0892409 A2 | 1/1999 |

OTHER PUBLICATIONS

English translation of the Written Opinion of the International Search Authority in the international application No. PCT/CN2021/073981, dated Apr. 28, 2021.
Supplementary European Search Report in the European application No. 21773437.5, dated Jul. 25, 2022.
International Search Report in the international application No. PCT/CN2021/073981, dated Apr. 28, 2021.

* cited by examiner

MEMORY BANK AND MEMORY

CROSS-REFERENCE TO RELATED APPLICATIONS

This is a continuation of International Patent Application No. PCT/CN2021/073981 filed on Jan. 27, 2021, which claims priority to Chinese Patent Application No. 202010237983.6 filed on Mar. 30, 2020. The disclosures of these applications are hereby incorporated by reference in their entirety.

BACKGROUND

Dynamic Random-Access Memory (DRAM) is a semiconductor storage device often used in computers, and is composed of many repetitive storage units. Each storage unit usually includes a capacitor and a transistor. A gate of the transistor is connected with a word line, a drain is connected with a bit line, and a source is connected with the capacitor. A voltage signal on the word line can control the transistor to be turned on or turned off to further read data information stored in the capacitor through the bit line or write data information in the capacitor for storage through the bit line.

SUMMARY

Embodiments of the present application relate generally to the technical field of semiconductors, and more specifically to a memory bank and a memory.

Various embodiments of the disclosure provide a bank and a memory as a solution to the technical problem.

Some embodiments of the disclosure provide a bank, which includes at least one storage module, each storage module including a read-write control circuit, a column decoding circuit and a plurality of storage arrays arranged along a first direction which are divided into at least one first unit and at least one second unit. The first decoding selective signal line is electrically connected to the column decoding circuit and the storage arrays in the first unit and the second decoding selective signal line is electrically connected to the column decoding circuit and the storage arrays in the second unit. The first data signal line is electrically connected to the read-write control circuit and the storage arrays in the first unit and the second data signal line is electrically connected to the read-write control circuit and the storage arrays in the second unit.

In some embodiments, one first unit and one second unit are provided in which both the first unit and the second unit are a high address unit or both are a low address unit.

In some embodiments, the first data signal line is electrically connected to all storage arrays in the first unit and the second data signal line is electrically connected to all storage arrays in the second unit.

In some embodiments, the number of the storage arrays in the first unit is the same as that of the storage arrays in the second unit.

In some embodiments, both the first data signal line and the second data signal line are electrically connected to the read-write control circuit.

In some embodiments, the bank includes a shift switch module, the shift switch module being configured to electrically connect either the first data signal line or the second data signal line to the read-write control circuit.

In some embodiments, the shift switch module may include a control unit and a switch unit where the control unit generates a control signal based on the received row decoding signal and based on the control signal, the switch unit is configured to connect either the read-write control circuit with the first data signal line or the read-write control circuit with the second data signal line.

In some embodiments, the switch unit includes a first switch and a second switch, where the first switch connects the first data signal line and the read-write control circuit, and the second switch connects the second data signal line and the read-write control circuit.

In some embodiments, the bank includes two storage modules with one storage module being a high address module and the other storage module being a low address module.

In some embodiments, the bank includes a positioning control module where the positioning control module is configured to control a row decoding signal generated by a row decoding circuit so that the row decoding circuit simultaneously positions and selects the first unit of the high address module and the second unit of the low address module or simultaneously positions and selects the second unit of the high address module and the first unit of the low address module.

In some embodiments, the first unit includes a first high address unit and a first low address unit and the second unit includes a second high address unit and a second low address unit.

In some embodiments, the first data signal line is electrically connected to the read-write control circuit and the storage arrays in the first high address unit; the second data signal line is electrically connected to the read-write control circuit and the storage arrays in the second low address unit; and the bank may further include: a third data signal line, the third data signal line being electrically connected to the read-write control circuit and the storage arrays in the second high address unit; and a fourth data signal line, the fourth data signal line being electrically connected to the read-write control circuit and the storage arrays in the first low address unit.

In some embodiments, the first data signal line and the third data signal line are the same bus; and the second data signal line and the fourth data signal line are the same bus.

In some embodiments, the first low address unit is adjacent to the second high address unit; or the first low address unit and the second high address unit are spaced apart by the second low address unit.

In some embodiments, the bank includes two storage modules.

In some embodiments, the column decoding circuit includes: a first column decoding circuit and a second column decoding circuit, where the first decoding selective signal line is electrically connected to the first column decoding circuit and the storage arrays in the first unit, and the second decoding selective signal line is electrically connected to the second column decoding circuit and the storage arrays in the second unit.

In some embodiments, the first column decoding circuit and the second column decoding circuit are respectively located on the opposing sides of the plurality of storage arrays.

The first decoding selective signal line and the second decoding selective signal line are electrically connected to the same column decoding circuit.

In some embodiments, the bank includes: a row decoding circuit, used to send a row decoding signal to position and select either the first unit or the second unit.

Correspondingly, the embodiments of the application further provide memory including the bank of the aforementioned embodiment.

Compared with existing technologies, the technical solutions provided by the application have the following advantages.

The embodiments of the application provide the bank with an excellent structural performance, which includes a column decoding circuit that positions and selects storage arrays of the first unit and the first decoding selective signal line, a column decoding circuit that positions and selects storage arrays of the second unit and the second decoding selective signal line, a first data signal line for implementing data transmission between the storage arrays in the first unit and a read-write control circuit, and a second data signal line for implementing data transmission between the storage arrays in the second unit and the read-write control circuit. In a single read-write operation, only the first decoding selective signal line or the second decoding selective signal line is enabled. As the first decoding selective signal line is only electrically connected to part of the storage arrays, i.e., having electrical contacts, and the second decoding selective signal line is only electrically connected to part of the storage arrays, the electric contacts in the single read-write operation are reduced and the parasitic resistance and parasitic capacitance of the bank are also reduced, thus reducing a power consumption of the bank. In addition, the first data signal line and the second data signal line for the data transmission are both electrically connected to part of the storage arrays, such that the electric contacts in the single read-write operation are reduced and the parasitic resistance and parasitic capacitance of the bank are also reduced, thus reducing the power consumption of the bank.

In addition, the bank further includes a shift switch module, where the shift switch module is configured to shift either the first data signal line or the second data signal line to electrically connect to the read-write control circuit. Therefore, when the first data signal line transmits a data signal, the second data signal line is completely disconnected from the circuit, to avoid the problem of heat loss resulting from the second data signal line, further reducing the power consumption of the bank; and likewise, when the second data signal line transmits a data signal, the first data signal line is completely disconnected from the circuit, to avoid the problem of heat loss resulting from the first data signal line, further reducing the power consumption of the bank.

In addition, the first unit includes a first high address unit and a first low address unit, and the second unit includes a second high address unit and a second low address unit. Therefore, high data and low data can be acquired in the same unit, and only one unit is selected in each time of row decoding. This way, the bank is able to save more electricity, further reducing the power consumption of the bank.

DETAILED DESCRIPTION

DRAM includes Double Data Rate (DDR) DRAM, Graphics Double Data Rate (GDDR) DRAM, and Low Power Double Data Rate (LPDDR) DRAM. With the application of the DRAM to more fields, for example, the increasing application of the DRAM to the mobile fields, user expectations for the speed index of the DRAM have increased.

The performance of a DRAM often does not meet the low power consumption requirements.

Figure 1:
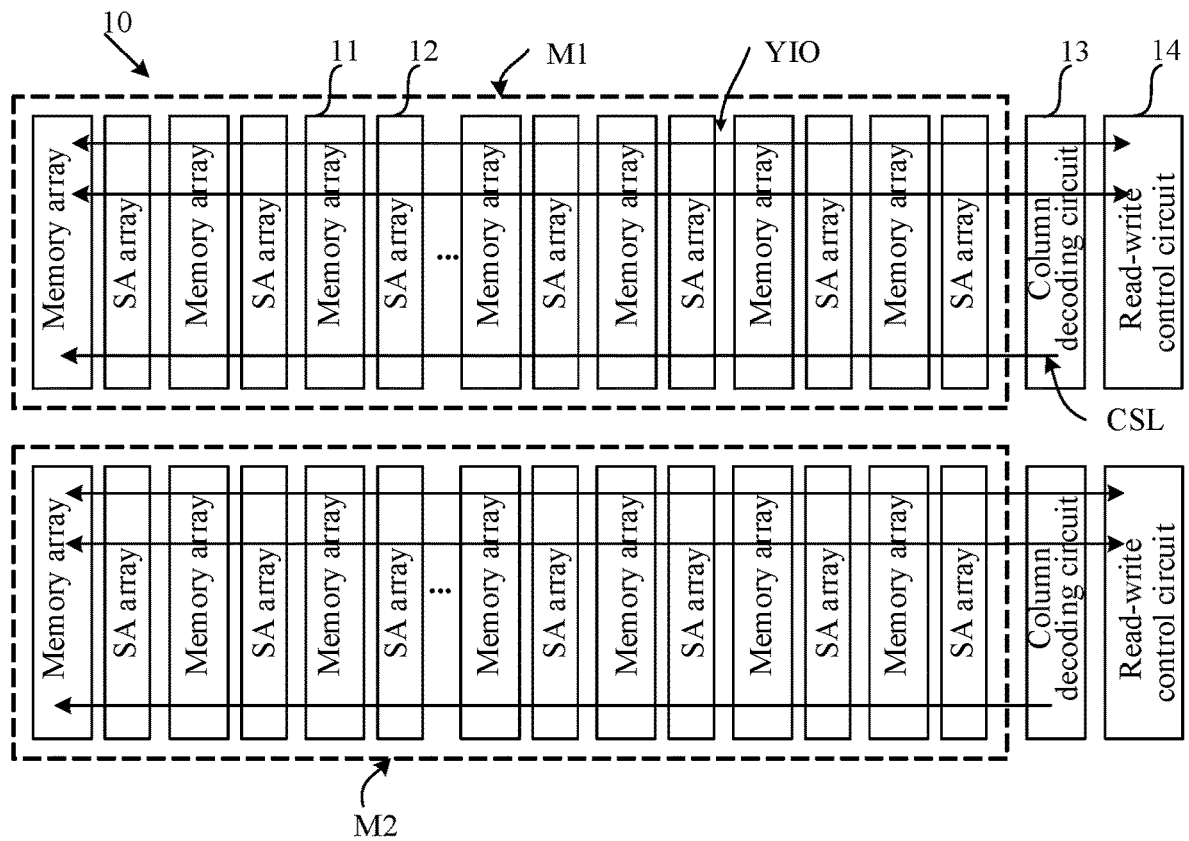
FIG. 1 is a structural schematic diagram of a DARM.

The analysis is made on the combined structural schematic diagram of the DRAM. FIG. 1 is a structural schematic diagram of a DARM. Referring to FIG. 1, the DRAM is composed of multiple banks 10 (also referred to as memory banks). Each bank 10 includes several storage arrays. Each storage array includes a memory array 11 and a Sense Amplifier (SA) array 12. The DRAM, regardless of whether the DDR (such as DDR2/3/4) series or the LPDDR (such as LPDDR2/3/4/5) series, divides bank 10 into a high-level group and a low-level group according to output pins (DQ). That is, each bank may also be correspondingly divided into two half banks. One half bank serves as a first module M1, and the first module M1 provides a low-level output pin; and the other half bank serves as a second module M2, and the second module M2 provides a high-level output pin. The high level and the low level refer to that whether the data bit is high or low. The low-level output pin transmits data at a low bit, and the high-level output pin transmits data at a high bit.

The decoding selective signal line CSL receives a column selective signal output by a column decoding circuit (YDEC) 13, and the data signal line YIO is configured to transmit data between the selected memory array 11 and the read-write control circuit 14. Regardless of the half bank in the low-level group or the half bank in the high-level group, in order to smoothly complete read and write operations, the decoding selective signal line CSL has an electrical contact with each memory array 11 in the half bank, and the electrical contact correspondingly generates a parasitic capacitance. Both the decoding selective signal line CSL and the data signal line YIO are long, causing a large parasitic resistance, which results in the problem of large power consumption in each read and write time, resulting in high power consumption of the DRAM.

It is found through further analysis that the parasitic resistance and the parasitic capacitance are also main reasons to cause the large power consumption of the DRAM. For the decoding selective signal line CSL, in each time of the read operation or the write operation, the electrical contact between each set of decoding selective signal line CSL and each memory array 11 has the parasitic capacitance and parasitic resistance. Like, for the data signal line YIO, in each time of the read operation or the write operation, the electrical contact between each set of data signal line YIO and each memory array 11 has the parasitic capacitance and parasitic resistance. Due to a number of electric contacts, the corresponding parasitic capacitances and parasitic resistances are large to cause the large power consumption of the DRAM.

In order to solve the above-mentioned problems, embodiments of the present application provide a bank with an excellent structural performance. Through the special structural design, the parasitic capacitance and parasitic resistance of the bank are reduced, thereby reducing the power consumption of the bank.

In order to make the objectives, technical solutions and advantages of the present application clearer, embodiments of the present application are described below in detail in combination with the accompanying drawings. However, those of ordinary skill in the art may understood that many technical details are provided to better understand the present application in the embodiments of the present application. However, the technical solutions claimed by the present application may also be implemented based various changes and modifications of the following embodiments even though there are no these technical details.

Figure 2:
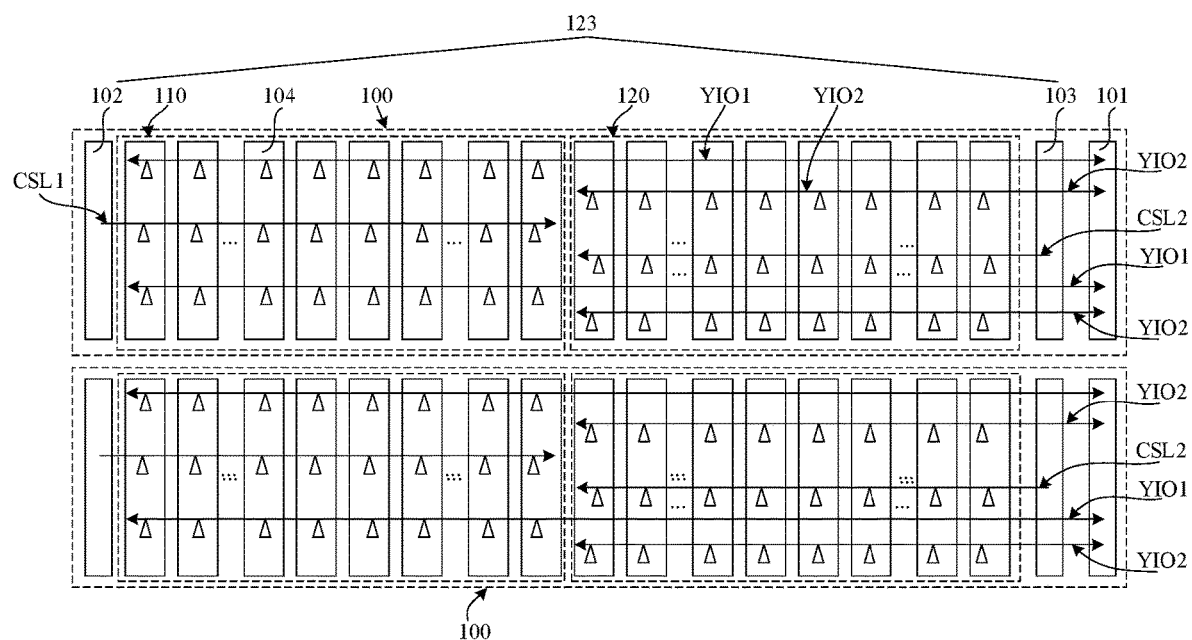
FIG. 2 is a structural schematic diagram of a bank provided by an embodiment of the application.

FIG. 2 is a structural schematic diagram of a bank provided by an embodiment of the present application.

Referring to FIG. 2, in the embodiment, the bank may include at least one storage module 100, each storage module 100 including: a read-write control circuit 101, a column decoding circuit 123 and a plurality of storage arrays 104 arranged along a first direction, the plurality of storage arrays 104 being divided into at least one first unit 110 and at least one second unit 120; a first decoding selective signal line CSL1, the first decoding selective signal line CSL1 being electrically connected to the column decoding circuit 123 and the storage arrays 104 in the first unit 110, such that the column decoding circuit 123 positions the storage arrays 104 located in the first unit 110; a second decoding selective signal line CSL2, the second decoding selective signal line CSL2 being electrically connected to the column decoding circuit 123 and the storage arrays 104 in the second unit 120, such that the column decoding circuit 123 positions the storage arrays 104 located in the second unit 120; a first data signal line YIO1, the first data signal line YIO1 being electrically connected to the read-write control circuit 101 and the storage arrays 104 in the first unit 110; and a second data signal line YIO2, the second data signal line YIO2 being electrically connected to the read-write control circuit 101 and the storage arrays 104 in the second unit 120.

Figure 3:
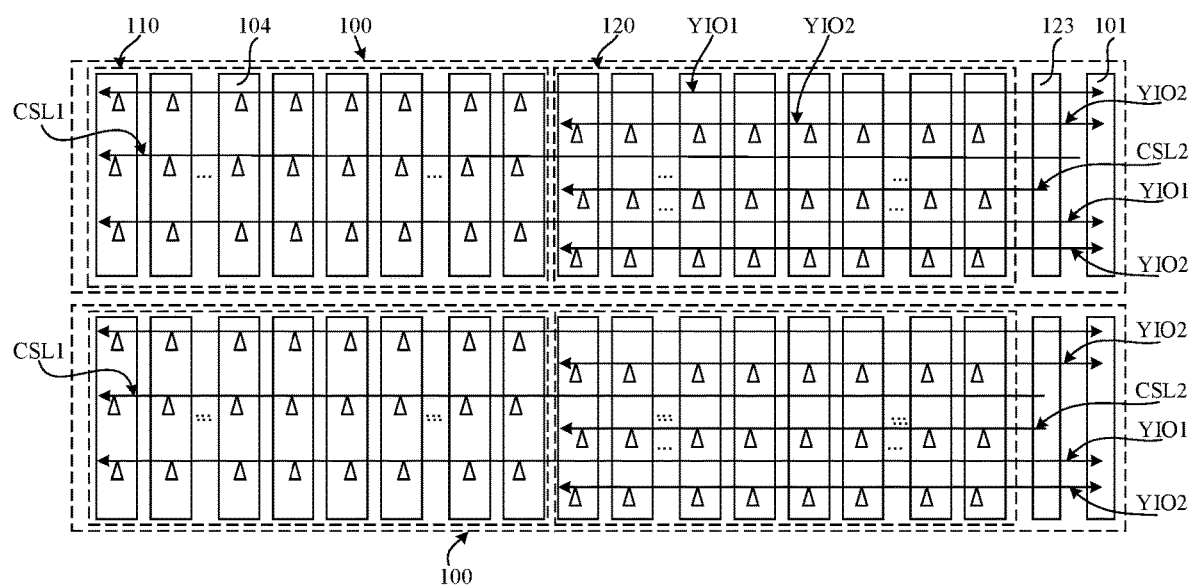
FIG. 3 is another structural schematic diagram of a bank provided by an embodiment of the application.

The embodiment will be described below in detail in combination with accompanying drawings. It should be noted that the triangular symbol labeled in FIG. 2 and FIG. 3 represents a presence of the electrical connection, i.e., having the electrical contact, and the triangular symbol not labeled represents an absence of the electrical connection, i.e., not having the electrical contact, for the convenience of description.

In the embodiment, the bank includes two storage modules 100, one storage module 100 being a high address module, and the other storage module 100 being a low address module. For example, when the number of bits of the bank is 16 bits, the number of bits of the low address module is low 8 bits, and the number of bits of the high address module is high 8 bits.

Correspondingly, in the embodiment, one first unit 110 and one second unit 120 are provided; and both the first unit 110 and the second unit 120 are a high address unit, or, both the first unit 110 and the second unit 120 are a low address unit. The first unit 110 and the second unit 120 of one storage module 100 are the high address units, and the storage module 100 is referred to as the high storage module for the convenience of description. The first unit 110 and the second unit 120 of the other storage module 100 are the low address units, and the storage module 100 is referred to as the low storage module for the convenience of description. In FIG. 2, a case where the upper storage module 100 serves as the high storage module, and the lower storage module 100 serves as the low storage module is taken as an example. It is understandable that the number of the first units and the second units may be designed according to an actual storage requirement in other embodiments.

Each storage module 104 includes a memory array and a sense amplifier (SA) array. The memory array includes multiple storage elements and is configured to store data; and the SA array is configured to amplify an output signal of the memory array. The first unit 110 includes the first number of storage arrays 104, and the second unit 120 may include the second number of storage arrays 104. The first number and the second number may be the same, or may be different.

In the embodiment, the number of the storage arrays 104 in the first unit 110 is the same as that of the storage arrays 104 in the second unit 120.

In the embodiment, the column decoding circuit 123 includes: a first column decoding circuit 102 and a second column decoding circuit 103, the first decoding selective signal line CSL1 is electrically connected to the first column decoding circuit 102 and the storage arrays 104 in the first unit 110, and the storage arrays 104 in the first unit 110 is positioned and selected through the first column decoding circuit 102; and the second decoding selective signal line CSL2 is electrically connected to the second column decoding circuit 103 and the storage arrays 104 in the second unit 120, and the storage arrays 104 in the second unit 120 is positioned and selected through the second column decoding circuit 103.

The first column decoding circuit 102 outputs a first positioning signal. Through the first decoding selective signal line CSL1, the storage arrays 104 in the first unit 110 is positioned and selected, to facilitate the read operation or write operation on the selected storage array 104. The second column decoding circuit 103 outputs a second positioning signal. Through the second decoding selective signal line CSL2, the storage arrays 104 in the second unit 120 is selected, to facilitate the read operation or write operation on the selected storage array 104. More specifically, the first decoding selective signal line CSL1 is electrically connected to all storage arrays 104 in the first unit 110; and the second decoding selective signal line CSL2 is electrically connected to all storage arrays in the second unit 120.

In the embodiment, in order to further reduce the lengths of the first decoding selective signal line CSL1 and the second decoding selective signal line CSL2, and to further reduce the resistance and reduce the power consumption, the first column decoding circuit 102 and the second column decoding circuit 103 are respectively located on two opposing sides of the plurality of storage arrays 104.

FIG. 3 is another structural schematic diagram of a bank provided by an embodiment of the present application. As shown in FIG. 3, in other embodiments, for the first unit 110 and the second unit 120, there may also be one column decoding circuit 123. The column decoding circuit 123 may position and select the storage arrays 104 of the first unit 110, and may further position and select the storage arrays 104 of the second unit 120. The first decoding selective signal line CSL1 and the second decoding selective signal line CSL2 are electrically connected to the same column decoding circuit 123. In addition, different banks 100 may have the independent column decoding circuit 123, or the different banks 100 may share a same column decoding circuit 123.

The first decoding selective signal line CSL1 spans the storage arrays 104 in the first unit 110; and the second decoding selective signal line CSL2 spans the storage arrays 104 in the second unit 120. The first data signal line YIO1 spans the plurality of storage arrays 104, i.e., crossing the first unit 110 and the second unit 120, and is only electrically connected to the storage arrays 104 in the first unit 110; and the second data signal line YIO2 spans the storage arrays 104 in the second unit 120. More specifically, the first data signal line YIO1 is electrically connected to all storage arrays 104 in the first unit 110; and the second data signal line YIO2 is electrically connected to all storage arrays 104 in the second unit 120.

In the embodiment, a situation where each storage module 100 is provided with 2 sets of first data signal lines YIO1 and 2 sets of second data signal lines YIO2 is taken as an example. In other embodiments, the number of sets of the first data signal lines and the second data signal lines may be designed according to an actual storage requirement.

In the embodiment, both the first data signal line YIO1 and the second data signal line YIO2 are electrically connected to the read-write control circuit 101.

Figure 4:
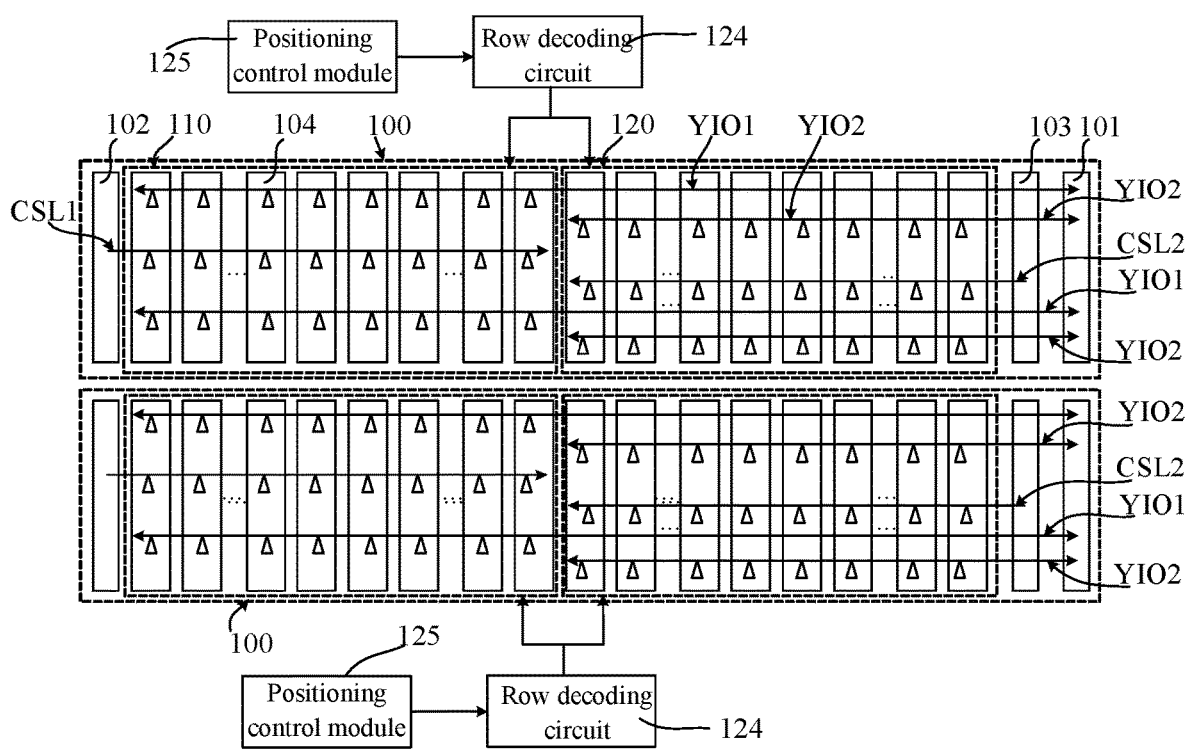
FIG. 4 is another structural schematic diagram of a bank provided by an embodiment of the application.

As shown in FIG. 4, FIG. 4 is still another structural schematic diagram of a bank provided by an embodiment of the present application. The storage module 100 may further include a row decoding circuit 124, configured to send a row decoding signal, to position and select either the first unit 110 or the second unit 120. Different banks 100 may have the independent row decoding circuit 124, or the different banks 100 may share a same row decoding circuit 124.

Specifically, the row decoding circuit 124 only enables the first decoding selective signal line CSL1 and the first column decoding circuit 102 when positioning and selecting the first unit 110; and the row decoding circuit 124 only enables the second decoding selective signal line CSL1 and the second column decoding circuit 103 when positioning and selecting the second unit 120.

Compared with a solution in which all storage arrays are electrically connected with the same decoding selective signal line, in the embodiment, in the single read operation or write operation, with the case where the first decoding selective signal line CSL1 and the first column decoding circuit 102 are enabled by only enabling either the first decoding selective signal line CSL1 or the second decoding selective signal line CSL2 for example, the number of the electrical contacts between the first decoding selective signal line CSL1 and the storage arrays 104 is reduced, and the number of the electrical contacts between the first data signal line YIO1 and the storage arrays 104 is also reduced. Therefore, not only can the parasitic circuit and parasitic capacitance in the bank be reduced, but the load on the first decoding selective signal line CSL1 and the first data signal line YIO1 is also significantly reduced, and thus the power consumption of the bank can be reduced remarkably. It is to be understood that when only the second decoding selective signal line CSL2 and the second column decoding circuit 103 are enabled, the power consumption of the bank can also be reduced remarkably to further reduce power consumption.

In addition, as the lengths of the second data signal line YIO2 spanning the storage arrays 104 in the second unit 120 and the second data signal line YIO2 spanning the storage arrays 104 are reduced, the short second data signal line YIO2 is beneficial to further reducing the resistance of the second data signal line YIO2 and the power consumption, thereby further reducing the power consumption of the bank.

For the convenience of understanding and description, the working principle of the write operation is described below in combination with the bank.

In one write operation, when a row decoding signal output by the row decoding circuit 124 points to the first unit 110, only the first column decoding circuit 102 and the first decoding selective signal line CSL1 are enabled, and the storage arrays in the first unit 110 is selected; and the first data signal line YIO1 writes data output by the read-write control circuit 101 into the selected storage arrays 104 in the first unit 110, the second decoding selective signal line CSL2 is not enabled, and the second data signal line YIO2 does not transmit a data signal. As the first decoding selective signal line CSL1 has the short length and with less load, and the load on the first data signal line YIO1 is less, the bank in the write operation has the low power consumption. It is to be understood that the less load refers to that the number of storage arrays 104 electrically connected is small, i.e., the electrical contacts are few, and the parasitic capacitance is small.

In another write operation, when the row decoding signal output by the row decoding circuit 124 points to the second unit 120, only the second column decoding circuit 103 and the second decoding selective signal line YIO2 are enabled, and the storage arrays 104 in the second unit 120 is selected; and the second data signal line YIO2 writes data output by the read-write control circuit 101 into the selected storage arrays 104 in the second unit 120, the first decoding selective signal line CSL1 is not enabled, and the first data signal line YIO1 does not transmit a data signal. As the second decoding selective signal line CSL2 has the short length and with less load, and the second data signal line YIO2 has the short length and with less load, the bank in the write operation has a low power consumption.

In the embodiment, the bank may further include: a positioning control module 125, the positioning control module 125 being configured to control a row decoding signal generated by a row decoding circuit 124, such that the row decoding signal simultaneously positions and selects a first unit 110 of the high address module and a second unit 120 of the low address module, or simultaneously positions and selects a second unit 120 of the high address module and a first unit 110 of the low address module. Specifically, the positioning control module 125 is electrically connected to the row decoding circuit 124, and is applied to sending a positioning control signal to the row decoding circuit 124; and the row decoding circuit 124 generates the row decoding signal based on the positioning control signal.

Therefore, during each read operation or write operation, the total lengths of the first data signal line YIO1 and the second data signal line YIO2 that are functioning for the data transmission are equal, such that the current consumption distribution of each read operation or write operation is evenly distributed, and the excessively large current peak is avoided, thereby further improving the performance of the bank. For the convenience of understanding, a situation that the bank performs the read operation is taken as an example to make descriptions in combination with the working principle of the bank.

In the previous read operation, the first unit 110 in the high address module and the second unit 120 in the low address module are selected at the same time. For the high address module, the first data signal line YIO1 functions for data transmission; for the low address module, the second data signal line YIO2 functions for data transmission; and the length of the data transmission bus is the total length of the first data signal line YIO1 and the second data signal line YIO2.

In the later read operation, the second unit 120 in the high address module and the first unit 110 in the low address module are selected at the same time. For the high address module, the second data signal line YIO2 functions for data transmission; for the low address module, the first data signal line YIO1 functions for data transmission; and the length of the data transmission bus is the total length of the first data signal line YIO1 and the second data signal line YIO2.

As can be seen from the above analysis, the length of the data transmission bus in each read operation keeps unchanged, so the heat consumed by the data transmission bus is the same, and the number of the loads is the same, and thus it is ensured that the current consumption is even during a working process, thereby further improving the performance of the bank.

It can be understood that, in other embodiments, the working mode of the bank may also be that: the first unit of the high address module and the first unit of the low address module are selected at the same time, and the second unit of the high address module and the second unit of the low address module are selected at the same time.

To summarize the above, the bank provided by the embodiment has the small electric quantity consumed each time, and the corresponding bank has the advantage of the low power consumption.

Another embodiment of the present application further provides a bank. The bank is approximately the same as the bank provided by the above embodiment. The difference lies in that the bank may further include a shift switch module, the shift switch module being configured to shift either the first data signal line or the second data signal line to be electrically connected to the read-write control circuit. The bank provided by the embodiment will be described below in combination with the accompanying drawings. It should be noted that parts same with or corresponding to the above embodiment may refer to the detailed descriptions on the above embodiment, and will not be repeatedly described in detail.

Figure 5:
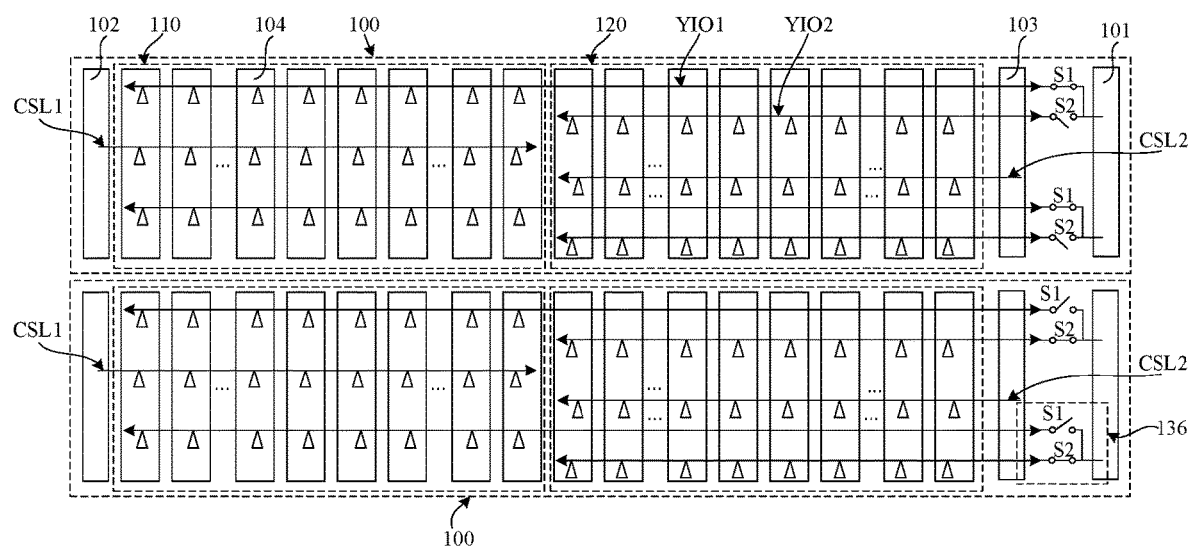
FIG. 5 is a structural schematic diagram of a bank provided by another embodiment of the application.
Figure 6:
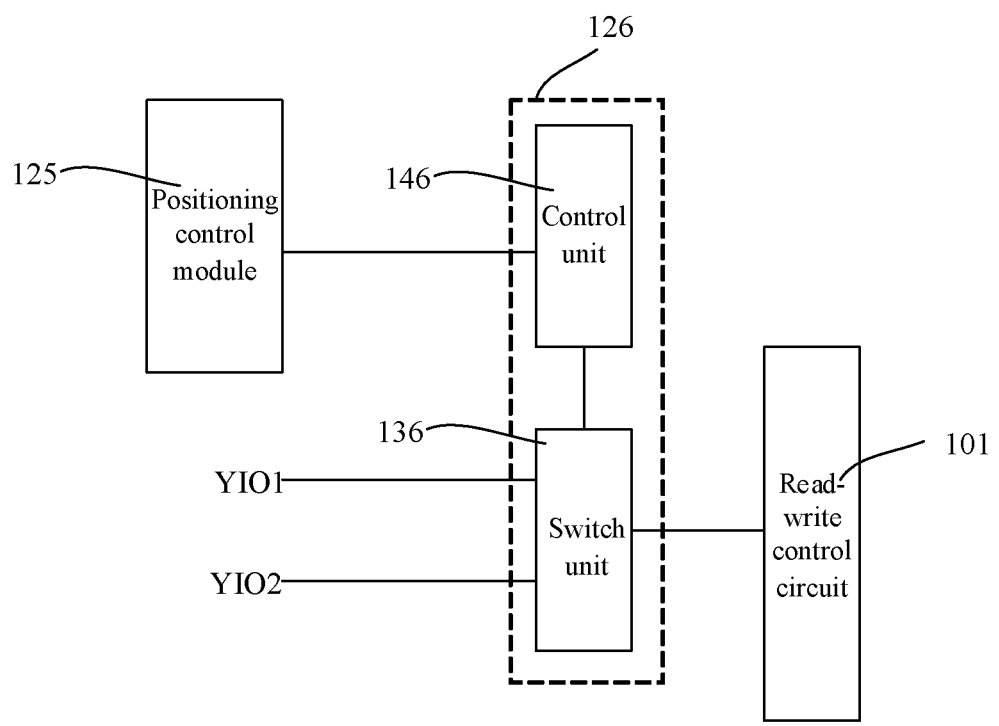
FIG. 6 is a local structural schematic diagram of a bank provided by another embodiment of the application.

FIG. 5 is a structural schematic diagram of a bank provided by another embodiment of the present application. FIG. 6 is a local structural schematic diagram of a bank provided by another embodiment of the present application.

Referring to FIG. 5 and FIG. 6, in the embodiment, the bank may include: a storage module 100, each storage module 100 including: a read-write control circuit 101, a first column decoding circuit 102, a second column decoding circuit 103, and a plurality of storage arrays 104 arranged along a first direction; a first decoding selective signal line CSL1; a second decoding selective signal line CSL2; a first data signal line YIO1; a second data signal line YIO2; and a shift switch module 126, the shift switch module 126 being configured to shift either the first data signal line YIO1 or the second data signal line YIO2 to be electrically connected to the read-write control circuit 101.

It is understandable that in the embodiment, a situation that the column decoding circuit includes the first column decoding circuit 102 and the second column decoding circuit 103 is taken as an example. In other embodiments, there may also be only one column decoding circuit. The first decoding selective signal line and the second decoding selective signal line are electrically connected to the column decoding circuit.

As a resulting of the arrangement of the shift switch module 126, only one the first data signal line YIO1 or the second data signal line YIO2 is connected to the circuit in the single read operation or write operation, thereby further reducing the heat consumed by the data signal line, and further reducing the power consumption of the bank.

Specifically, the shift switch module 126 includes a switch unit 136 and a control unit 146; the control unit 146 is configured to generate a control signal based on a received row decoding signal; and the switch unit 136 is configured to connect the read-write control circuit 101 and the first data signal line YIO1, or, connect the read-write control circuit 101 and the second data signal line YIO2, based on the control signal.

The switch unit 136 includes a first switch S1 and a second switch S2, the first switch S1 is connected between the first data signal line YIO1 and the read-write control circuit 101, and the second switch S2 is connected between the second data signal line YIO2 and the read-write control circuit 101. The control unit 146 controls the first switch S1 to close or open, and controls the second switch S2 to close or open, based on the row decoding signal.

It is understandable that the first switch S1 or the second switch S2 may be composed of at least one Metal Oxide Semiconductor (MOS) tube. The first switch S1 is closed, and the first data signal line YIO1 is electrically connected to the read-write control circuit 101; the first switch S1 is open, the first data signal line YIO1 is disconnected from the read-write control circuit 101; the second switch S2 is closed, and the second data signal line YIO2 is electrically connected to the read-write control circuit 101; and the second switch S2 is open, and the second data signal line YIO2 is disconnected from the read-write control circuit 101.

For the same storage module 100, the number of switch units 136, the number of sets of the first data signal lines YIO1, and the number of sets of the second data signal lines YIO2 are the same. In the embodiment, there are two switch units 136. In other embodiments, the number of the switch units may also be reasonably provided according to the number of the sets of the first data signal lines and the second data signal lines.

As described in the above embodiment, the upper storage module 100 in FIG. 5 serves as the high storage module, and the lower storage module 100 serves as the low storage module. The bank may further include: a positioning control module 125. The detailed descriptions on the positioning control module 125 may refer to the above embodiment. The positioning control module 125 is connected to the shift switch module 126. The shift switch module 126 shifts the switch based on a positioning control signal sent by the positioning control module 125, such that the first data signal line YIO1 or the second data signal line YIO2 is electrically connected to the read-write control circuit 101.

Specifically, when the row decoding signal positions and selects a first unit 110 of the high address module and a second unit 120 of the low address module, the first switch S1 in the high address module is closed and the switch S2 is open, and the first switch S1 in the low address module is open and the second switch S2 is closed; and when the row decoding signal positions and selects a second unit 120 of the high address module and a first unit 110 of the low address module, the first switch S2 in the high address module is open and the switch S2 is closed, and the first switch S1 in the low address module is closed and the second switch S2 is open.

For the convenience of understanding, the working principle of the bank provided by the embodiment will be described below in combination with the accompanying drawings.

As shown in FIG. 5, in the previous write operation, the first unit 110 of the high address module and the second unit 120 of the low address module are selected; for the high address module, the first column decoding circuit 102 and the first decoding selective signal line CSL1 are enabled, the first switch S1 is closed and the second switch S2 is open, the first data signal line YIO1 is connected to the circuit, and the second data signal line YIO2 is disconnected from the circuit; and for the low address module, the second column decoding circuit 102 and the second decoding selective signal line CSL2 are enabled, the first switch S1 is open and the second switch S2 is closed, the first data signal line YIO1 is disconnected from the circuit, and the second data signal line YIO2 is connected to the circuit.

In the next write operation, the second unit 120 of the high address module and the first unit 110 of the low address module are selected; for the high address module, the second column decoding circuit 102 and the second decoding selective signal line CSL2 are enabled, the first switch S1 is open and the second switch S2 is closed, the first data signal line YIO1 is disconnected from the circuit, and the second data signal line YIO2 is connected to the circuit; and for the low address module, the first column decoding circuit 102 and the first decoding selective signal line CSL1 are enabled, the first switch S1 is closed and the second switch S2 is open, the first data signal line YIO1 is connected to the circuit, and the second data signal line YIO2 is disconnected from the circuit.

Compared with the above embodiment, in this embodiment, the first data signal line YIO1 or the second data signal line YIO2 is completely disconnected from the circuit when not functioning for electrical signal transmission, which is beneficial to further reducing the power consumption of the bank. It is discovered through researches that when the number of storage arrays in the plurality of storage arrays is 145, the bank can save the current by 12 mA at a Baud rate of 3,733.

Still another embodiment of the present application further provides a bank. Different from the above two embodiments, the first unit and the second unit in the above embodiments are only either the high address unit or the low address unit. In the embodiment, the first unit includes a first high address unit and a first low address unit, and the second unit includes a second high address unit and a second low address unit. The bank provided by the embodiment will be described below in combination with the accompanying drawings. It should be noted that parts same with or corresponding to the above embodiment may refer to the detailed descriptions on the above embodiment, and will not be repeatedly described in detail.

Figure 7:
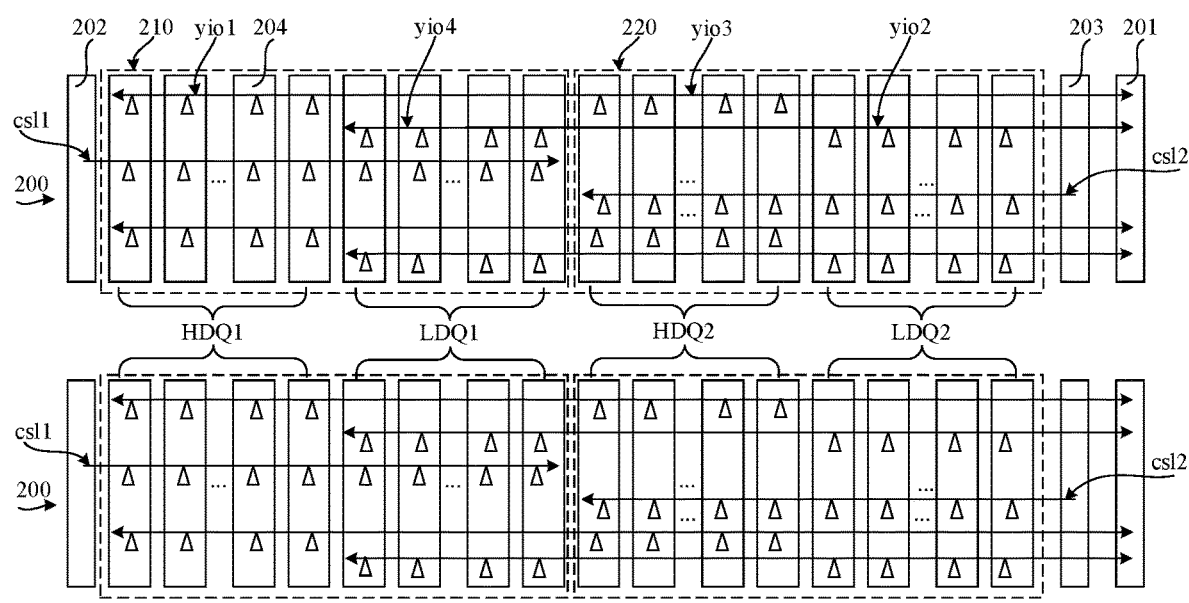
FIG. 7 is a structural schematic diagram of a bank provided by another embodiment of the application.

FIG. 7 is a structural schematic diagram of a bank provided by another embodiment of the present application.

Referring to FIG. 7, in the embodiment, the bank includes at least one storage module 200, each storage module 200 including: a read-write control circuit 201, a column decoding circuit and a plurality of storage arrays 204 arranged along a first direction, the plurality of storage arrays 204 being divided into at least one first unit 210 and at least one second unit 220; a first decoding selective signal line csl1; a second decoding selective signal line csl2; a first data signal line yio1; and a second data signal line yio2.

In the embodiment, the column decoding circuit includes a first column decoding circuit 202 and a second column decoding circuit 203, the first decoding selective signal line csl1 is electrically connected to the first column decoding circuit 202 and the storage arrays 204 of the first unit 210, and the second decoding selective signal line csl2 is electrically connected to the second column decoding circuit 203 and the storage arrays 204 of the second unit 220. In other embodiments, there may also be one column decoding circuit.

The first unit 210 includes a first high address unit HDQ1 and a first low address unit LDQ1; and the second unit 220 includes a second high address unit HDQ2 and a second low address unit LDQ2. In the embodiment, the first low address unit HDQ1 and the second high address unit HDQ2 are adjacent, i.e., the first high address unit HDQ1, the first low address unit LDQ1, the second high address unit HDQ2, and the second low address unit LDQ2 are arranged sequentially.

It is to be understood that in other embodiments, the first low address unit and the second high address unit are spaced apart by the second low address unit, i.e., the second low address unit and the second high address unit may be interchangeable in position; and correspondingly, the first high address unit, the first low address unit, the second low address unit, and the second high address unit are arranged sequentially.

In the embodiment, the first decoding selective signal line csl1 is electrically connected to the first column decoding circuit 202 and all storage arrays 204 in the first unit 210, such that the first decoding selective signal line csl2 positions and selects any storage arrays 204 in the first unit 210 based on the first column decoding circuit 202; and the second decoding selective signal line csl2 is electrically connected to all storage arrays 204 in the second unit 220, such that the second decoding selective signal line csl2 positions and selects any storage arrays 204 in the second unit 220 based on the second column decoding circuit 203.

In the embodiment, the bank further includes a row decoding circuit, configured to send a row decoding signal, to position and select either the first unit 210 or the second unit 220.

The first data signal line yio1 is electrically connected to the read-write control circuit 201 and all storage arrays 204 in the first high address unit HDQ1; the second data signal line yio2 is electrically connected to the read-write control circuit and all storage arrays in the second low address unit LDQ2; and the bank further includes a third data signal line yio3, the third data signal line yio3 being electrically connected to the read-write control circuit 201 and all storage arrays in the second high address unit HDQ2; and a fourth data signal line yio4, the fourth data signal line yio4 being electrically connected to the read-write control circuit 201 and all storage arrays 204 in the first low address unit LDQ1.

FIG. 7 shows 2 sets of the first data signal lines yio1 and 2 sets of the second data signal lines yio2 in each storage module 200. It is to be understood that there may be any number of the sets of the first data signal lines yio1 and the second data signal lines yio2 in other embodiments.

In the embodiment, the bank includes two storage modules 200, each storage module 200 being provided with the high address unit and the low address unit. In other embodiments, the bank may also only include one storage module, or, may further include any other number of storage modules.

Taking a case that the bank has two storage modules 200 as an example, each storage module 200 includes one first unit 210 and one second unit 220, the bank is divided into 2 first units 210 and 2 second units 220, the first unit 210 is provided with the first high address unit HDQ1 and the first low address unit LDQ1, and the second unit is provided with the second high address unit HDQ2 and the second low address unit LDQ2, that is, each first unit 210 and each second unit 220 are provided with a high level and a low level at the same time. Therefore, during row decoding, the read operation or the write operation may be performed by selecting only one first unit 210 or one second unit 220, such that the length of the first decoding selective signal line csl1 or the second decoding selective signal line csl2 is short and the load is significantly reduced, and the length of the first data signal line yio1, the second data signal line yio2, the third data signal line yio3 or the fourth data signal line yio4 is short and the load is significantly reduced; and in the single read operation or write operation, the total electrical contacts between the signal line and the storage arrays 204 are reduced, and the corresponding parasitic resistance and parasitic capacitance of the bank to affect the read operation and the write operation are significantly reduced. In this way, more current of the first column decoding circuit 202 and the second column decoding circuit 203 may be saved to reduce the power consumption of the bank.

For the convenience of understanding, a bank will be described below in combination with a working principle of the bank.

Taking a case that the row decoding signal selects the first unit 210 of the upper storage module 200 as an example, by only enabling the first column decoding circuit 202 and the first decoding selective signal line csl1, the specified storage arrays 204 of the first high address unit HDQ1 and the specified storage arrays 204 of the first low address unit LDQ1 are positioned and selected; the first data signal line yio1 transmits a data signal between the specified storage arrays 204 in the first high address unit HDQ1 and the read-write control circuit 201; and the fourth data signal line yio4 transmits a signal before the specified storage arrays 204 in the first low address unit LDQ1 and the read-write control circuit 201. Therefore, the read operation or the write operation in the first unit 210 is completed.

Taking a case that the row decoding signal selects the second unit 220 of the upper storage module 200 as an example, by only enabling the second column decoding circuit 203 and the second decoding selective signal line csl2, the specified storage arrays 204 of the second high address unit HDQ2 and the specified storage arrays 204 of the second low address unit LDQ2 are positioned and selected; the second data signal line yio2 transmits a data signal between the specified storage arrays 204 in the second high address unit LDQ2 and the read-write control circuit 201; and the third data signal line yio3 transmits a signal between the specified storage arrays 204 in the second high address unit HDQ2 and the read-write control circuit 201. Therefore, the read operation or the write operation in the second unit 220 is completed.

In the embodiment, the first data signal line yio1 and the third data signal line yio3 are the same bus, and the second data signal line yio2 and the fourth data signal line yio4 are the same bus; and for convenience of illustration and description, yio1 and yio3 are labeled on the same bus, and yio2 and yio4 are labeled on the same bus in FIG. 7. Therefore, while the structural complexity is simplified, the length of the bus is reduced, and the resistance of the bus and the consumed heat are further reduced, thereby further reducing the power consumption of the bank. It is found by researches that when the number of storage arrays in the plurality of storage arrays is 145, the bank can save the current by 10 mA at a Baud rate of 3,733.

Figure 8:
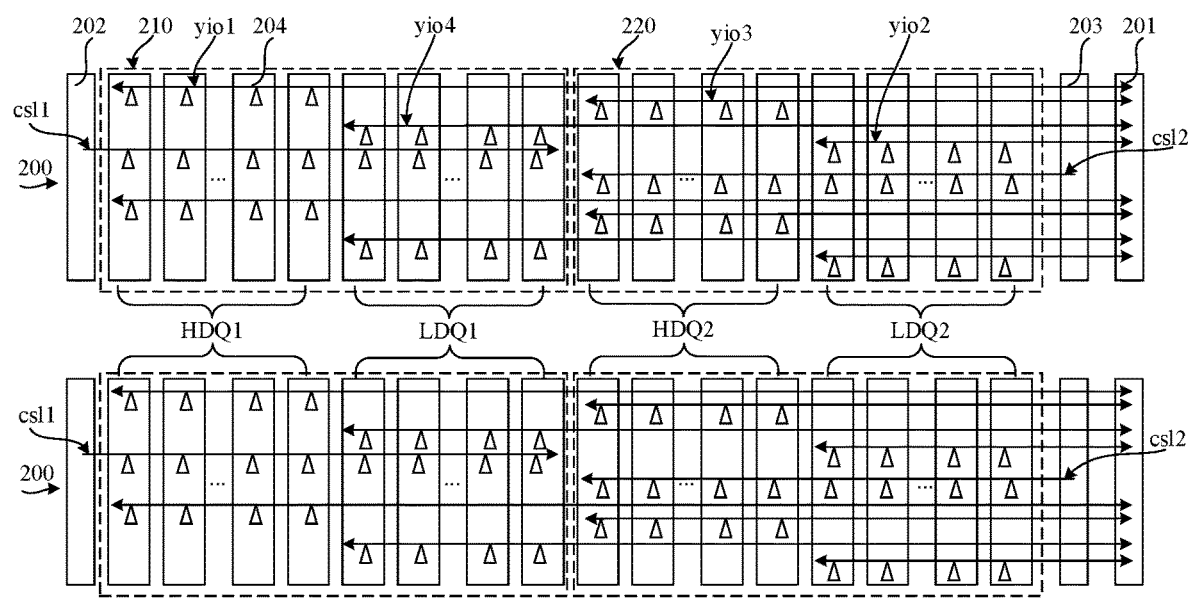
FIG. 8 is another structural schematic diagram of a bank provided by another embodiment of the present application.

It should be noted that, in other embodiments, as shown in FIG. 8, FIG. 8 is another structural schematic diagram of the bank in the embodiment. The third data signal line yio3 and the first data signal line yio1 are independent of one another, i.e., being different buses; and the fourth data signal line yio4 and the second data signal line yio2 are independent of one another, i.e., being different buses.

In the embodiment, the number of the storage arrays 204 in the first unit 210 is the same as that of the storage arrays 204 in the second unit 220, the number of the storage arrays 204 in the first high address unit HDQ1 is the same as that of the storage arrays 204 in the first low address unit LDQ1, and the number of the storage arrays 204 in the second high address unit HDQ2 is the same as that of the storage arrays 204 in the second low address unit LDQ2. Therefore, during each read operation or write operation, the number of the storage arrays 204 involved is the same, which is beneficial to averaging the current consumption of the bank, and avoiding the excessively large current peak, to further improve the performance of the bank.

It is understandable that, in other embodiments, the number of the storage arrays in the first unit may also be different from that of the storage arrays in the second unit, the number of the storage arrays in the first high address unit may also be different from that of the storage arrays in the first low address unit, and the number of the storage arrays in the second high address unit may also be different from that of the storage arrays in the second low address unit.

To summarize the above, the bank provided by the embodiment can further reduce the power consumption, and further reduce the electricity consumed.

Correspondingly, embodiments of the present application further provide a memory, which includes at least one bank in any one of the above embodiments. The column decoding circuits of different banks may be shared, may be independent of one another; and the read-write control circuits of different banks may be shared, or may be independent of one another.

The memory may be the DRAM or Static Random Access Memory (SRAM). As can be seen from the above analysis, the memory provided by the embodiment has the advantage of the low power consumption, and the consumed electricity is significantly reduced.

Those of ordinary skill in the art may understand that the above embodiments are specific embodiments to implement the present application. In practical applications, various changes may be made in forms and details without departing from the spirit and scope of the present application. Any person skilled in the art may make changes and modifications without departing from the spirit and scope of the present application. Therefore, the scope of protection of the present application should be subject to the scope defined by the appended claims.

What is claimed is:

1. A bank, comprising at least one storage module, each of the at least one storage module comprising:
   a read-write control circuit, a column decoding circuit, and a plurality of storage arrays arranged along a first direction, the plurality of storage arrays being divided into at least one first unit and at least one second unit, wherein each of the plurality of storage arrays comprises a memory array and a sense amplifier (SA) array, and each SA array is spaced from each memory array in the first direction;

a first decoding selective signal line, the first decoding selective signal line being electrically connected to the column decoding circuit and storage arrays in the first unit;

a second decoding selective signal line, the second decoding selective signal line being electrically connected to the column decoding circuit and storage arrays in the second unit;

a first data signal line, wherein the first data signal line is electrically connected to the read-write control circuit and the storage arrays in the first unit, and the first data signal line spans the storage arrays in the first unit and the storage arrays in the second unit; and a second data signal line, wherein the second data signal line is electrically connected to the read-write control circuit and the storage arrays in the second unit, and the second data signal line spans the storage arrays in the second unit.

2. The bank of claim 1, wherein one first unit and one second unit are provided; and both the first unit and the second unit are a high address unit, or, both the first unit and the second unit are a low address unit.

3. The bank of claim 2, wherein the first data signal line is electrically connected to all of the storage arrays in the first unit;

the second data signal line is electrically connected to all of the storage arrays in the second unit, wherein both the first data signal line and the second data signal line are electrically connected to the read-write control circuit.

4. The bank of claim 2, further comprising: a shift switch module configured to shift either the first data signal line or the second data signal line to be electrically connected to the read-write control circuit.

5. The bank of claim 4, wherein the shift switch module comprises: a control unit and a switch unit;

the control unit is configured to generate a control signal based on a received row decoding signal; and the switch unit is configured to connect the read-write control circuit and the first data signal line, or, connect the read-write control circuit and the second data signal line, based on the control signal.

6. The bank of claim 5, wherein the switch unit comprises a first switch and a second switch;

the first switch is connected between the first data signal line and the read-write control circuit; and the second switch is connected between the second data signal line and the read-write control circuit.

7. The bank of claim 2, wherein the bank comprises two storage modules, one of the two storage modules being a high address module, and another one of the storage modules being a low address module.

8. The bank of claim 7, wherein the bank further comprises: a positioning control module configured to control a row decoding signal generated by a row decoding circuit, such that the row decoding circuit simultaneously positions and selects a first unit of the high address module and a second unit of the low address module, or simultaneously positions and selects a second unit of the high address module and a first unit of the low address module.

9. The bank of claim 1, wherein the first unit comprises a first high address unit and a first low address unit; and the second unit comprises a second high address unit and a second low address unit.

10. The bank of claim 9, wherein the first data signal line is electrically connected to the read-write control circuit and the storage arrays in the first high address unit; and the second data signal line is electrically connected to the read-write control circuit and the storage arrays in the second low address unit.

11. The bank of claim 10, further comprising:

a third data signal line electrically connected to the read-write control circuit and the storage arrays in the second high address unit; and a fourth data signal line electrically connected to the read-write control circuit and the storage arrays in the first low address unit.

12. The bank of claim 11, wherein the first data signal line and the third data signal line are a same bus; and the second data signal line and the fourth data signal line are a same bus.

13. The bank of claim 12, wherein the first low address unit is neighboring with the second high address unit; or the first low address unit and the second high address unit are spaced apart by the second low address unit.

14. The bank of claim 9, wherein the bank comprises two storage modules.

15. The bank of claim 1, wherein the column decoding circuit comprises: a first column decoding circuit and a second column decoding circuit;

the first decoding selective signal line is electrically connected to the first column decoding circuit and the storage arrays in the first unit; and the second decoding selective signal line is electrically connected to the second column decoding circuit and the storage arrays in the second unit.

16. The bank of claim 15, wherein the first column decoding circuit and the second column decoding circuit are respectively located on two opposing sides of the plurality of storage arrays.

17. The bank of claim 1, wherein the first decoding selective signal line and the second decoding selective signal line are electrically connected to a same column decoding circuit.

18. The bank of claim 1, further comprising: a row decoding circuit, configured to send a row decoding signal, to position and select either the first unit or the second unit.

19. A memory, comprising the bank of claim 1.

20. The bank of claim 1, wherein the first decoding selective signal line spans the storage arrays in the first unit, and the second decoding selective signal line spans the storage arrays in the second unit.

* * * * *